United States Patent [19]

Stauffer

[11] 4,425,501
[45] Jan. 10, 1984

[54] LIGHT APERTURE FOR A LENSLET-PHOTODETECTOR ARRAY

[75] Inventor: Norman L. Stauffer, Englewood, Colo.

[73] Assignee: Honeywell Inc., Minneapolis, Minn.

[21] Appl. No.: 249,032

[22] Filed: Mar. 30, 1981

[51] Int. Cl.³ .......................... H01J 3/14; H01J 40/14
[52] U.S. Cl. .................................. 250/216; 250/578; 250/237 R; 350/167
[58] Field of Search ............... 250/216, 204, 201, 578, 250/237 R, 239; 356/152; 350/167

[56] References Cited

U.S. PATENT DOCUMENTS

| | | | |
|---|---|---|---|
| 2,795,705 | 6/1957 | Rabinow | 250/219 |
| 2,876,099 | 3/1959 | Schenk | 96/45 |
| 3,018,313 | 1/1962 | Gattone | 136/89 |
| 3,819,940 | 6/1974 | Laws | 250/227 |
| 3,873,829 | 3/1975 | Evrard et al. | 250/213 R |
| 4,055,761 | 10/1977 | Shimomura | 250/239 |
| 4,185,191 | 1/1980 | Stauffer | 250/204 |
| 4,230,941 | 10/1980 | Stauffer | 250/204 |
| 4,230,942 | 10/1980 | Stauffer | 250/204 |
| 4,246,476 | 1/1981 | Stauffer | 250/201 |
| 4,249,073 | 2/1981 | Stauffer | 250/204 |
| 4,250,377 | 2/1981 | Wilwerding | 250/204 |
| 4,254,330 | 3/1981 | Stauffer et al. | 250/201 |

FOREIGN PATENT DOCUMENTS 55-106420  8/1980  Japan .................................. 250/204

OTHER PUBLICATIONS

IBM Technical Disclosure "Modular Matrix Photodetector" vol. 13, No. 3, Aug. 1970, p. 699.

*Primary Examiner*—David C. Nelms
*Assistant Examiner*—Jere J. Brophy
*Attorney, Agent, or Firm*—Charles J. Ungemach

[57] ABSTRACT

An opaque mask having a plurality of apertures therein for use in an auto focus circuit which includes a plurality of lenslets formed in a transparent member and a printed circuit chip which includes radiation responsive detector areas and a circuit area, the mask permitting radiation to pass through the lenslets and be focused on the detector areas but preventing light from passing through transparent areas adjacent the lenslets and striking the circuit area.

4 Claims, 2 Drawing Figures

LIGHT APERTURE FOR A LENSLET-PHOTODETECTOR ARRAY

BACKGROUND OF THE INVENTION

In recent years the art of auto focussing cameras has developed to the point where a number of cameras that may automatically focus on an object are on the market. These systems may be divided into two categories, the first being the active system in which a beam of sound or light energy is transmitted from the camera to the object and the reflection is received by the camera and processed so as to determine the range to the object. The second category includes the passive systems in which light from the object is transmitted to the camera to produce two radiation patterns on two detector arrays spaced a known distance apart. The distance to the object is determined from the positions of the patterns on the two detector arrays.

One passive system has been proposed where light from the remote object passes through the taking lens of the camera and passes through a plurality of lenslets so as to create images of the exit pupil of the taking lens on pairs of detectors mounted behind the lenslets, the detectors usually being part of an integrated circuit chip. Such a system is found in my U.S. Pat. No. 4,185,191, issued Jan. 22, 1980.

One problem has been encountered in such systems due to the fact that the lenslets receiving light from the taking lens are molded in a transparent member which permits light not only to be focused by the lenslets on the detectors but also to be transmitted by the portions of the member which are adjacent the lenslets onto the integrated circuit chip. When this occurs, light striking the circuit areas in the chip may produce spurious signals that can produce error in the circuit operation. This appears to be caused by circuit elements which are light sensitive and produce unwanted carriers. Furthermore, when surface defects in the material adjacent the lenslets exist, scattering of light can be produced thus causing some light to reach the detector areas without passing through the lenslets which may also produce error in circuit operation.

SUMMARY OF THE INVENTION

The apparatus of the present invention utilizes a light aperture or masking means placed in the area adjacent the lenslets or adjacent the detector areas of the circuit chip which mask is opaque to light except in the areas of the aperture and thus prevents light from passing through the translucent member except through the lenslets and thus prevents light from reaching the circuit areas of the chip other than the detectors.

DETAILED DESCRIPTION OF THE PREFERRED EMBODIMENTS

Figure 1:
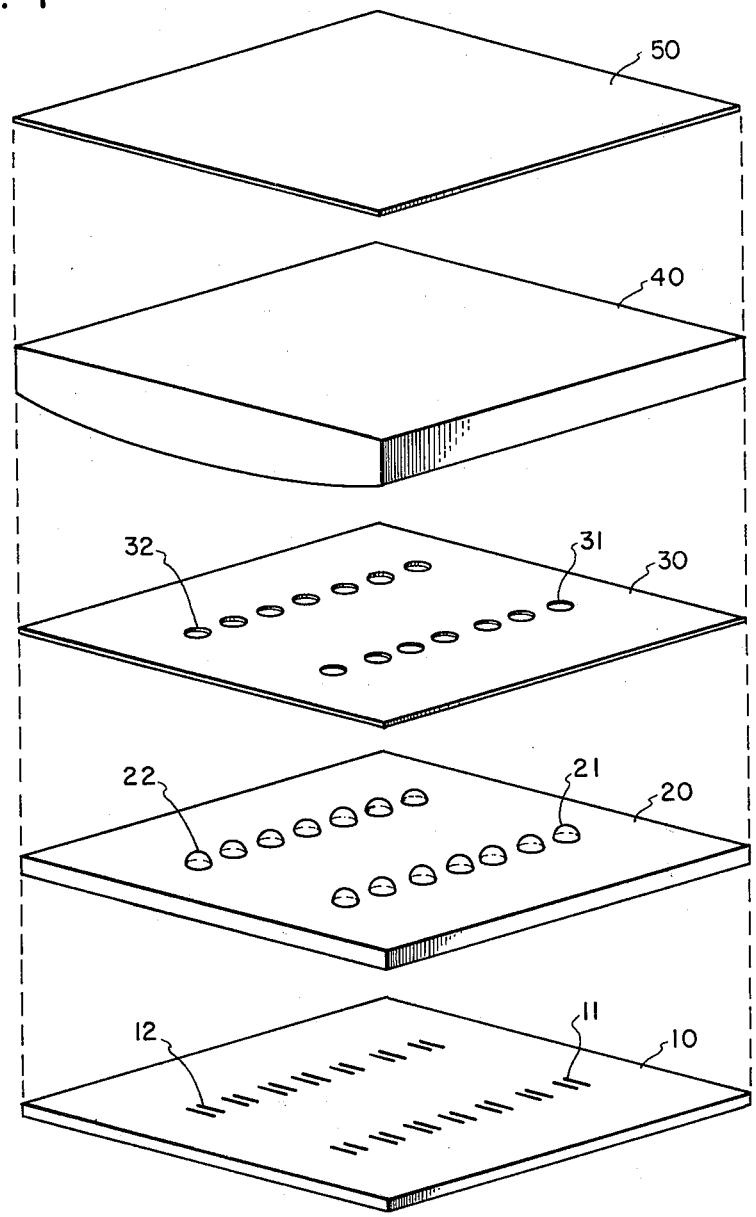
FIG. 1 is an exploded view of a through-the-lens sensing arrangement.

In FIG. 1, an integrated circuit chip 10 is shown upon which are positioned a plurality of detector pairs such as 11 and 12. The areas surrounding detectors 11 and 12 will normally contain circuit components for the signal processing circuitry receiving the signals from the detectors.

Mounted above the circuit chip 10 is a transparent member 20 upon which a plurality of lenslets such as 21 and 22 have been formed. Light passing through the lenslets forms an image of the exit pupil of the taking lens on each pair of detectors on chip 10. The outputs of the detectors are then used in determining the distance to the remote object as is explained in my above-mentioned U.S. Pat. No. 4,185,191. Two rows of detectors are shown on chip 10 for the purpose of accommodating different F-number lenses. More specifically, as is described in my U.S. Pat. No. 4,246,476, issued Jan. 20, 1981, different F-number lenses produce different sized exit pupil images and in order to place the detector pairs entirely within a desired image, different sized detector pairs are employed.

Mounted above the transparent lenslet structure 20 is an aperture mask 30 of the present invention. Aperture mask 30 is constructed of opaque material and has etched or otherwise formed therein a plurality of small apertures such as 31 and 32. The position and size of the apertures is such as to allow the lenslets on member 20 to project therethrough as will be better seen in connection with FIG. 2.

A corrector lens 40 is shown in FIG. 1 above the mask 30 and operates to cause light from the taking lens to pass through the lenslets generally in the direction of the optical axis of the lenslets rather than at an angle thereto as is described in my U.S. Pat. No. 4,230,941, issued Oct. 28, 1980.

Above the lens 40 is a filter 50 whose purpose is to block long wavelengths of light so as to correct for the fact that most lenses focus differently for long wavelengths than they do for short wavelengths.

Figure 2:
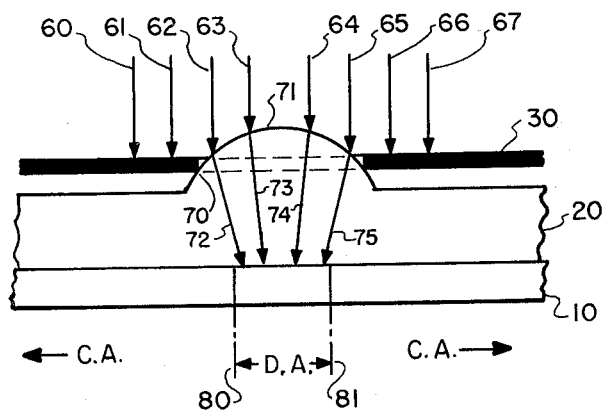
FIG. 2 is a view of one lenslet, the aperture mask and a portion of the integrated circuit chip associated therewith.

Turning now to FIG. 2, light from the corrector lens 40 is shown traveling downwards in FIG. 2 along paths such as is shown by arrows 60–67. A portion of the mask member 30 is shown having an aperture at 70. One of the lenslets 71 on the transparent member 20 of FIG. 1 is shown protruding through the aperture 70 so as to receive light rays 62, 63, 64 and 65 and to transmit them along paths shown by arrows 72, 73, 74 and 75 to the integrated circuit chip 10 and more particularly to the detector area defined between two dash-dot lines 80 and 81 and identified as "D.A." in FIG. 2. Two radiation responsive detectors are present in the area D.A. and it is seen that light between the area defined by arrows 62 and 65 will be transmitted to the detector area and operate to produce signals from the detectors in accordance with the intensity thereof. These signals are processed by circuitry lying to the left of dash-dot line 80 and to the right of dash-dot line 81 identified in FIG. 2 as C.A. on the circuit chip 10. It should be noticed that none of the light, such as shown by arrows 60, 61, 66 and 67, is permitted to pass through the transparent structure of member 20 and accordingly does not impinge upon the circuits in the circuit area C.A. Thus, the problem of generating spurious signals in the circuit structures in these areas is prevented. Likewise, since the mask 30 prevents light from striking areas between the lenslets, the scattering of light which may be caused by imperfections in the surface of the material of member 20, is likewise prevented.

While the mask 30 could be placed adjacent the circuit board 10 and under the lenslet member 20 to likewise mask out the circuit areas on the chip 10, this arrangement would not help the problem of imperfections in the surface of member 20 causing scattering of light to strike other detectors.

It is therefore seen that I have provided a means for overcoming the problem of light passing through areas of a lenslet array in such a way as to be received by the circuit apparatus on an auto focus module thus overcoming the problem of spuriously generated signals. Various modifications or improvements will occur to those skilled in the art. For example, the mask 30 might be created by metal evaporation onto the lenslet assembly while blocking or otherwise preventing the metal from coating the lenslets. Accordingly, I do not wish to be limited by the specific disclosures used in connection with the preferred embodiments but intend only to be limited by the following claims.

The embodiments of the invention in which an exclusive property or right is claimed are defined as follows:

1. Apparatus for use with an auto focus camera including a circuit chip having a plurality of radiation responsive detector areas and a circuit area adjacent the detector areas which circuit area may produce error signals for the auto focus camera if exposed to light and including a transparent member having a plurality of lenslets formed therein and placed contiguous the chip so that each lenslet directs radiation from a remote source onto one of the detector areas, the improvement comprising:

an opaque member having a plurality of transparent portions therein placed contiguous the transparent member so as to permit radiation through the lenslets to reach the detector areas and to prevent radiation through the transparent member from reaching the circuit area.

2. Apparatus according to claim 1 wherein the opaque member has a plurality of holes therein corresponding to the plurality of lenslets.

3. Apparatus according to claim 2 wherein the holes are positioned to accept the lenslets at least partially therethrough.

4. Apparatus according to claim 2 wherein the opaque member is vacuum deposited on the transparent member except in areas occupied by the lenslets.

* * * * *